United States Patent
Hatanaka et al.

(10) Patent No.: US 12,264,947 B2
(45) Date of Patent: Apr. 1, 2025

(54) MEASURING SYSTEM, MEASURING DEVICE, AND MEASURING METHOD

(71) Applicant: Tokyo Electron Limited, Tokyo (JP)

(72) Inventors: Takayuki Hatanaka, Miyagi (JP); Kimihiro Yokoyama, Miyagi (JP); Norihiko Amikura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 135 days.

(21) Appl. No.: 18/319,172

(22) Filed: May 17, 2023

(65) Prior Publication Data

US 2023/0375371 A1 Nov. 23, 2023

(30) Foreign Application Priority Data

May 19, 2022 (JP) ................. 2022-082269

(51) Int. Cl.
| | |
|---|---|
| *G01D 5/241* | (2006.01) |
| *G01B 7/00* | (2006.01) |
| *G01B 7/04* | (2006.01) |
| *G01B 7/14* | (2006.01) |
| *G01B 11/27* | (2006.01) |
| *H01L 21/687* | (2006.01) |

(52) U.S. Cl.
CPC ........... *G01D 5/2417* (2013.01); *G01B 7/003* (2013.01); *G01B 7/044* (2013.01); *G01B 7/14* (2013.01); *G01B 11/27* (2013.01); *H01L 21/68707* (2013.01); *G01D 5/2412* (2013.01)

(58) Field of Classification Search
CPC ...... G01D 5/2417; G01D 5/2412; G01B 7/14; G01B 7/003; G01B 7/044; G01B 11/27; H01L 21/68707; H01L 21/67259; H01L 21/67742; G01R 27/2605; G01R 1/02; G01R 1/0408
USPC ....................................... 324/662
See application file for complete search history.

(56) References Cited

U.S. PATENT DOCUMENTS

| | | | |
|---|---|---|---|
| 2013/0255382 A1* | 10/2013 | Tanaka ............... | G01P 15/125 73/514.32 |
| 2019/0162619 A1* | 5/2019 | Furuhata ............... | G01L 19/148 |
| 2022/0252436 A1* | 8/2022 | Yamamuro ......... | G01D 5/34761 |

FOREIGN PATENT DOCUMENTS

JP 2018-022721 A 2/2018

\* cited by examiner

*Primary Examiner* — Raul J Rios Russo
(74) *Attorney, Agent, or Firm* — Studebaker Brackett PLLC

(57) ABSTRACT

A measuring system according to an exemplary embodiment acquires a measurement value indicating electrostatic capacitance between a measuring device and a transport fork for transporting the measuring device. The transport fork includes a target electrode. The measuring device includes a first sensor provided on a base board. The first sensor includes a central electrode and peripheral electrodes. The central electrode acquires electrostatic capacitance for reflecting a distance with the target electrode. The peripheral electrodes are disposed around the central electrode to acquire electrostatic capacitance for reflecting an amount of deviation in a horizontal direction with respect to the target electrode of the transport fork.

9 Claims, 11 Drawing Sheets

MEASURING SYSTEM, MEASURING DEVICE, AND MEASURING METHOD

CROSS-REFERENCE TO RELATED APPLICATION

This application is based upon and claims the benefit of priority from Japanese Patent Application No. 2022-082269, filed May 19, 2022, the entire contents of which are incorporated herein by reference.

TECHNICAL FIELD

Exemplary embodiments of the present disclosure relate to a measuring system, a measuring device, and a measuring method.

BACKGROUND

Japanese Unexamined Patent Publication No. 2018-22721 discloses a teaching jig for calibrating a transport position of a wafer transport device. The teaching jig includes a first plate and a second plate. The first plate determines a substrate loading position in a forward/backward direction with respect to a substrate holder that holds a substrate. The first plate is provided with a target pin. The second plate is perpendicular to the first plate and movable in the forward/backward direction, and determines the substrate loading position in a leftward/rightward direction with respect to the substrate holder. The transport position of the wafer transport device is calibrated based on the teaching jig positioned by an operator.

SUMMARY

In one exemplary embodiment, there is provided a measuring system that acquires a measurement value indicating electrostatic capacitance between a measuring device and a first object for transporting the measuring device. The first object includes a body on which the measuring device is loaded, and a target electrode provided on the body. The measuring device includes a disc-shaped base board, a first sensor provided along a bottom surface of the base board, and a circuit board installed on the base board and connected to the first sensor. The first sensor includes a central electrode and peripheral electrodes. The central electrode acquires electrostatic capacitance for reflecting a distance with the target electrode. The peripheral electrodes are disposed around the central electrode to acquire electrostatic capacitance for reflecting an amount of deviation in a horizontal direction with respect to the target electrode of the first object.

DETAILED DESCRIPTION

Figure 1:
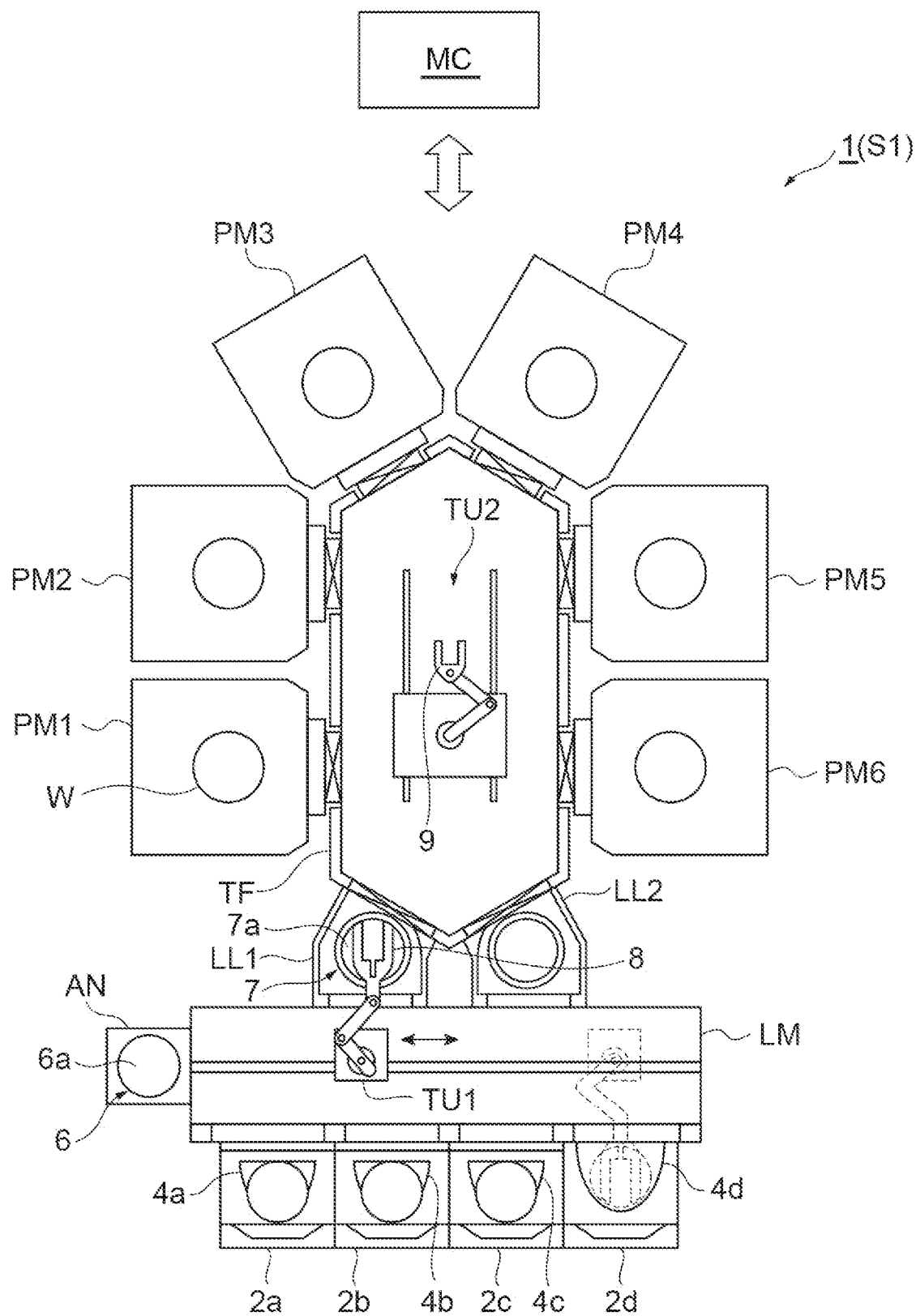
FIG. 1 is a view illustrating a processing system.

Hereinafter, various exemplary embodiments will be described.

In one exemplary embodiment, there is provided a measuring system that acquires a measurement value indicating electrostatic capacitance between a measuring device and a first object for transporting the measuring device. The first object includes a body on which the measuring device is loaded, and a target electrode provided on the body. The measuring device includes a disc-shaped base board, a first sensor provided along a bottom surface of the base board, and a circuit board installed on the base board and connected to the first sensor. The first sensor includes a central electrode and peripheral electrodes. The central electrode acquires electrostatic capacitance for reflecting a distance with the target electrode. The peripheral electrodes are disposed around the central electrode to acquire electrostatic capacitance for reflecting an amount of deviation in a horizontal direction with respect to the target electrode of the first object.

In the measuring system, the measuring device is transported by the first object in a state where the measuring device is loaded on the first object. When the first sensor of the measuring device faces the target electrode of the first object, the electrostatic capacitance between the first sensor and the target electrode is acquired by the measuring device. Since the electrostatic capacitance acquired by the peripheral electrode of the first sensor reflects the amount of deviation in the horizontal direction of the first sensor with respect to the target electrode, it is possible to acquire an amount of deviation of the measuring device which is an object to be transported. Therefore, the measuring device is transported by the first object, so that it is possible to easily measure position shift of the measuring device which is an object to be transported.

In one exemplary embodiment, the central electrode may have an area smaller than that of the target electrode. With this configuration, a range in which the central electrode overlaps the target electrode indicates constant electrostatic capacitance. That is, when the electrostatic capacitance acquired by the central electrode is within a predetermined range, it can be regarded that the measuring device is normally loaded on the first object.

In one exemplary embodiment, three or more peripheral electrodes may be disposed around the central electrode. With this configuration, the amount of deviation with respect to the target electrode can be measured based on a plurality of axial directions.

In one exemplary embodiment, the first object is a transport fork provided in a semiconductor processing system for transporting a workpiece.

In one exemplary embodiment, the first object is a first transport fork and a second transport fork provided in a semiconductor processing system for transporting a workpiece. The first transport fork has a first pad protruding upward. The second transport fork has a second pad protruding upward. The measuring device is loaded on the first transport fork while being supported by the first pad, and is loaded on the second transport fork while being supported by the second pad. A thickness of the first pad is different from a thickness of the second pad. With this configuration, it can be determined whether the measuring device is loaded on either the first transport fork or the second transport fork based on the electrostatic capacitance acquired by the central electrode.

In one exemplary embodiment, the measuring device further includes a plurality of second sensors arranged along an edge of the base board to acquire a measurement value indicating electrostatic capacitance between the measuring device and the second object. The second object has a circular loading surface in plan view, and when the base board is loaded on the loading surface so that a center of the loading surface coincides with a center of the base board, an outer peripheral edge of the loading surface faces a plurality of second sensors. With this configuration, when the measuring device is loaded on the second object by the first object, the measuring device can acquire the electrostatic capacitance indicating a positional relationship between the second object and the measuring device.

In one exemplary embodiment, the second object is a base of an aligner or a load lock module provided in the semiconductor processing system.

In one exemplary embodiment, there is provided a measuring device that acquires a measurement value indicating electrostatic capacitance between the measuring device and an object. The object includes a body on which the measuring device is loaded, and an electrode provided on the body. The measuring device includes a disc-shaped base board, a sensor provided along a bottom surface of the base board, and a circuit board installed on the base board and connected to the sensor. The sensor includes a central electrode and three or more peripheral electrodes. The central electrode has an area smaller than that of the electrode of the object and acquires electrostatic capacitance for reflecting a distance with the electrode. The three or more peripheral electrodes are disposed around the central electrode to acquire electrostatic capacitance for reflecting an amount of deviation in a horizontal direction with respect to the electrode of the first object.

In one exemplary embodiment, there is provided a measuring method of acquiring a measurement value indicating electrostatic capacitance between a measuring device and an object. The object includes a body on which the measuring device is loaded, and a target electrode provided on the body. The measuring device includes a disc-shaped base board, a sensor provided along a bottom surface of the base board, and a circuit board installed on the base board and connected to the sensor. The sensor includes a central electrode and three or more peripheral electrodes. The central electrode has an area smaller than that of the electrode of the object and acquires electrostatic capacitance for reflecting a distance with the electrode. The three or more peripheral electrodes are disposed around the central electrode to acquire electrostatic capacitance for reflecting an amount of deviation in a horizontal direction with respect to the electrode of the first object. The method includes holding the measuring device by the object so that the measuring device is loaded on the object. In addition, the method includes acquiring a plurality of measurement values, which indicate electrostatic capacitance, based on each of voltage amplitudes in the central electrode and the three or more peripheral electrodes by applying a radio frequency signal to the central electrode and the three or more peripheral electrodes.

Hereinafter, various embodiments will be described in detail with reference to the drawings. The same reference numerals will be given to the same or corresponding parts in each drawing.

The measuring device according to one exemplary embodiment can be transported by a processing system 1 that has a function as a transport system S1. First, a processing system that includes a processing device for processing a workpiece and a transport device for transporting the workpiece to the processing device will be described. FIG. 1 is a view illustrating a processing system. The processing system 1 includes tables 2a to 2d, containers 4a to 4d, a loader module LM, an aligner AN, a load lock modules LL1 and LL2, a process modules PM1 to PM6, a transfer module TF, and a controller MC. The number of tables 2a to 2d, the number of containers 4a to 4d, the number of load lock modules LL1 and LL2, and the number of process modules PM1 to PM6 are not limited, and any number of equal to or greater than one can be used.

The tables 2a to 2d are arranged along one edge of the loader module LM. The containers 4a to 4d are mounted on the tables 2a to 2d, respectively. Each of the containers 4a to 4d is, for example, a container called a front opening unified pod (FOUP). Each of the containers 4a to 4d can be configured to accommodate the workpiece W. The workpiece W has a substantially disc shape like a wafer.

Inside of the loader module LM, there is a chamber wall that defines a transport space under atmospheric pressure. A transport device TU1 is provided in this transport space. The transport device TU1 includes, for example, an articulated robot with a transport fork (first object) 8. The transport device TU1 is controlled by the controller MC. The transport device TU1 is configured to transport the workpiece W between the containers 4a to 4d and the aligner AN, between the aligner AN and the load lock modules LL1 to LL2, and between the load lock modules LL1 to LL2 and the containers 4a to 4d.

Figure 2:
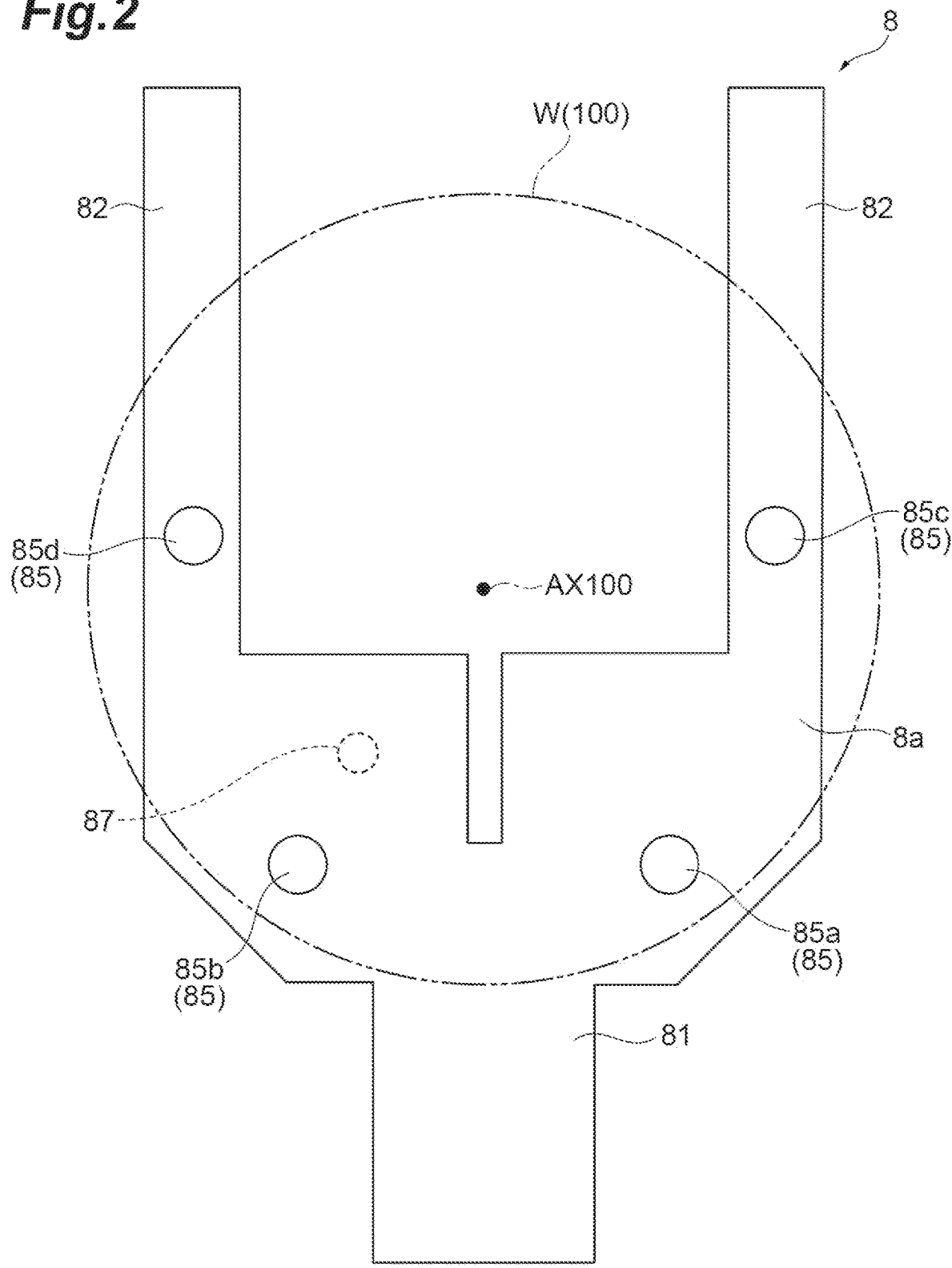
FIG. 2 is a schematic view for explaining a transport fork.

The transport fork 8 of the transport device TU1 is provided at a front end of a robot arm constituting the articulated robot. FIG. 2 is a schematic plan view for explaining the transport fork 8. As illustrated in FIG. 2, the transport fork 8 includes a base end portion 81 connected to the robot arm, and a pair of claw portions 82 bifurcated from the base end portion 81 and extending toward the front end. An upper surface 8a of the transport fork 8 may be flat. A pad portion 85 protruding upward is provided on the upper surface 8a. For example, the workpiece W is supported by the pad portion 85 having a predetermined thickness. The transport fork 8 and the pad portion 85 is formed of resin, for example.

An example of the pad portion 85 includes a plurality of pads 85a, 85b, 85c, and 85d. For example, the pads 85a and 85b are provided on the base end portion 81 of the transport fork 8, and the pads 85c and 85d are provided on the claw portion 82. In addition, a target electrode 87 is provided on the transport fork 8. The target electrode 87 may be embedded in the transport fork 8. An example of the target electrode 87 may be a disc-shaped metal member. The target electrode 87 in the illustrated example is provided on the base end portion 81 in plan view. The target electrode 87 may be provided at a position close to one of the pair of claw portions 82 (the left claw portion in the illustrated example).

The aligner AN is connected to the loader module LM. The aligner AN is configured to adjust the position of the workpiece W (calibrate the position). The aligner AN has a support stand 6. The support stand 6 is a stand that can rotate around the axis extending in the vertical direction. A loading surface 6*a*, which is an upper surface of the support stand 6, is configured to support the workpiece W. The support stand 6 is configured to be rotatable by a driving device controlled by the controller MC. The loading surface 6*a* of the support stand 6 has a circular shape in plan view. A diameter of the loading surface 6*a* may be smaller than a diameter of the workpiece W. For example, the support stand 6 is formed of a metal material.

In one example, the aligner AN may have an optical sensor that detects edges of the loaded workpiece W while the workpiece W is being rotated. Based on the result of detecting the edge, the optical sensor detects an amount of deviation of an angle position of a notch of the workpiece W with respect to a reference angle position and an amount of deviation of a center position of the workpiece W with respect to the reference position. For example, the controller MC calculates an amount of rotation of the support stand 6 for correcting the angle position of the notch to the reference angle position based on the amount of deviation of the angle position of the notch. In this way, the angle position of the notch can be corrected to the reference angle position. In addition, the controller MC may control a position of the transport fork 8 of the transport device TU1 when receiving the workpiece W from the aligner AN based on the amount of deviation of the center position of the workpiece W. In this way, the center position of the workpiece W coincides with the predetermined position on the end effector of the transport device TU1.

Each of the load lock module LL and the load lock module LL2 is provided between the loader module LM and the transfer module TF. Each of the load lock module LL1 and the load lock module LL2 provides a preliminary decompression chamber. Each of the load lock module LL1 and the load lock module LL2 is provided with a loading stand 7. A loading surface 7*a*, which is an upper surface of the loading stand 7, is configured to support the workpiece W. The loading surface 7*a* of the loading stand 7 has a circular shape in plan view. A diameter of the loading surface 7*a* may be smaller than the diameter of the workpiece W. In one example, the diameter of the loading surface 7*a* may be the same as the diameter of the loading surface 6*a* of the aligner AN. For example, the loading stand 7 is formed of a metal material.

The transfer module TF is airtightly connected to the load lock module LL1 and the load lock module LL2 via a gate valve. The transfer module TF provides a decompression chamber capable of reducing pressure. A transport device TU2 is provided in this decompression chamber. The transport device TU2 includes, for example, an articulated robot with a transport fork 9. The transport device TU2 is controlled by the controller MC. The transport device TU2 is configured to transport the workpiece W between the load lock modules LL1 to LL2 and the process modules PM1 to PM6, and between any two process modules of the process modules PM1 to PM6.

Figure 3:
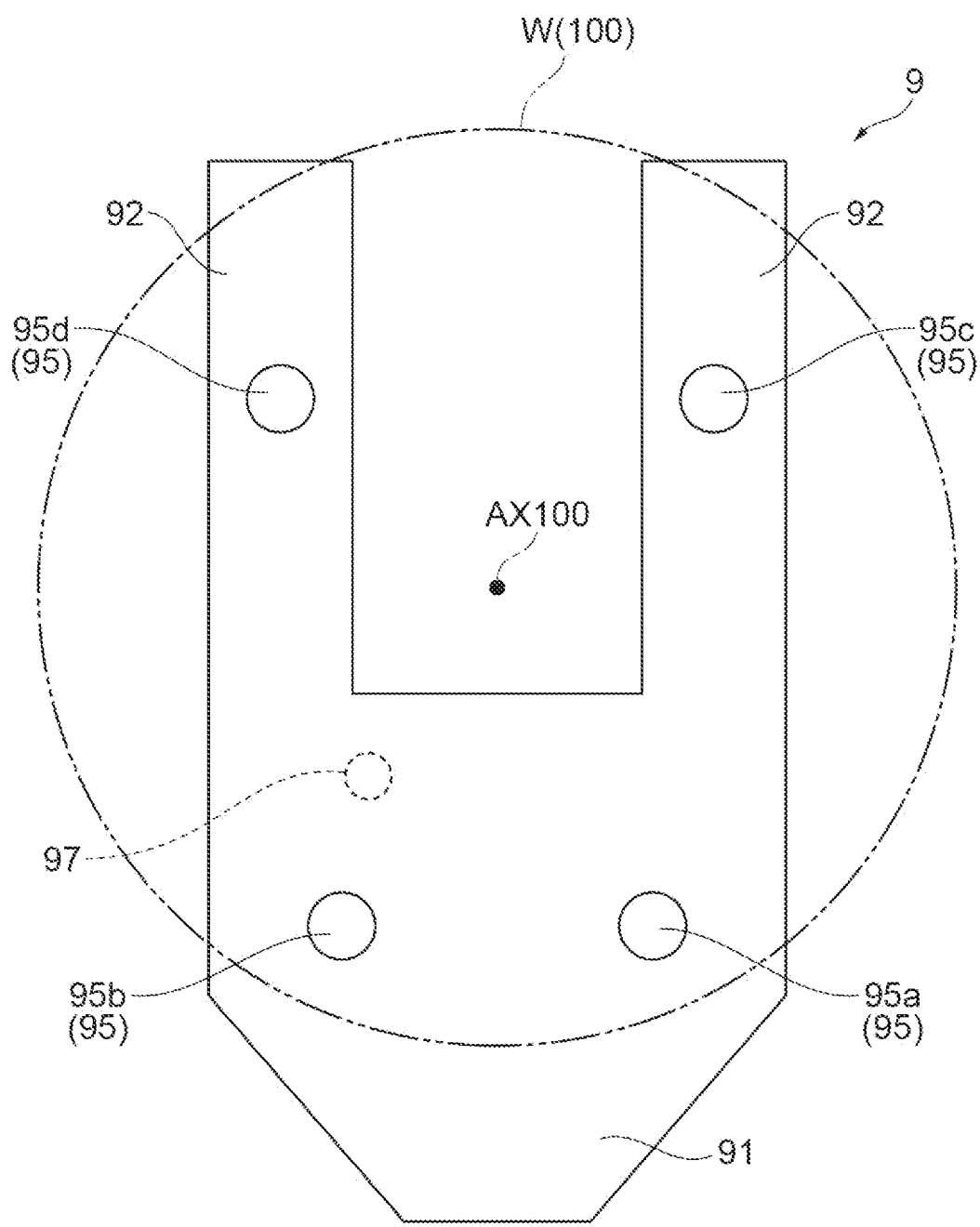
FIG. 3 is a schematic view for explaining the transport fork.
Figure 4:
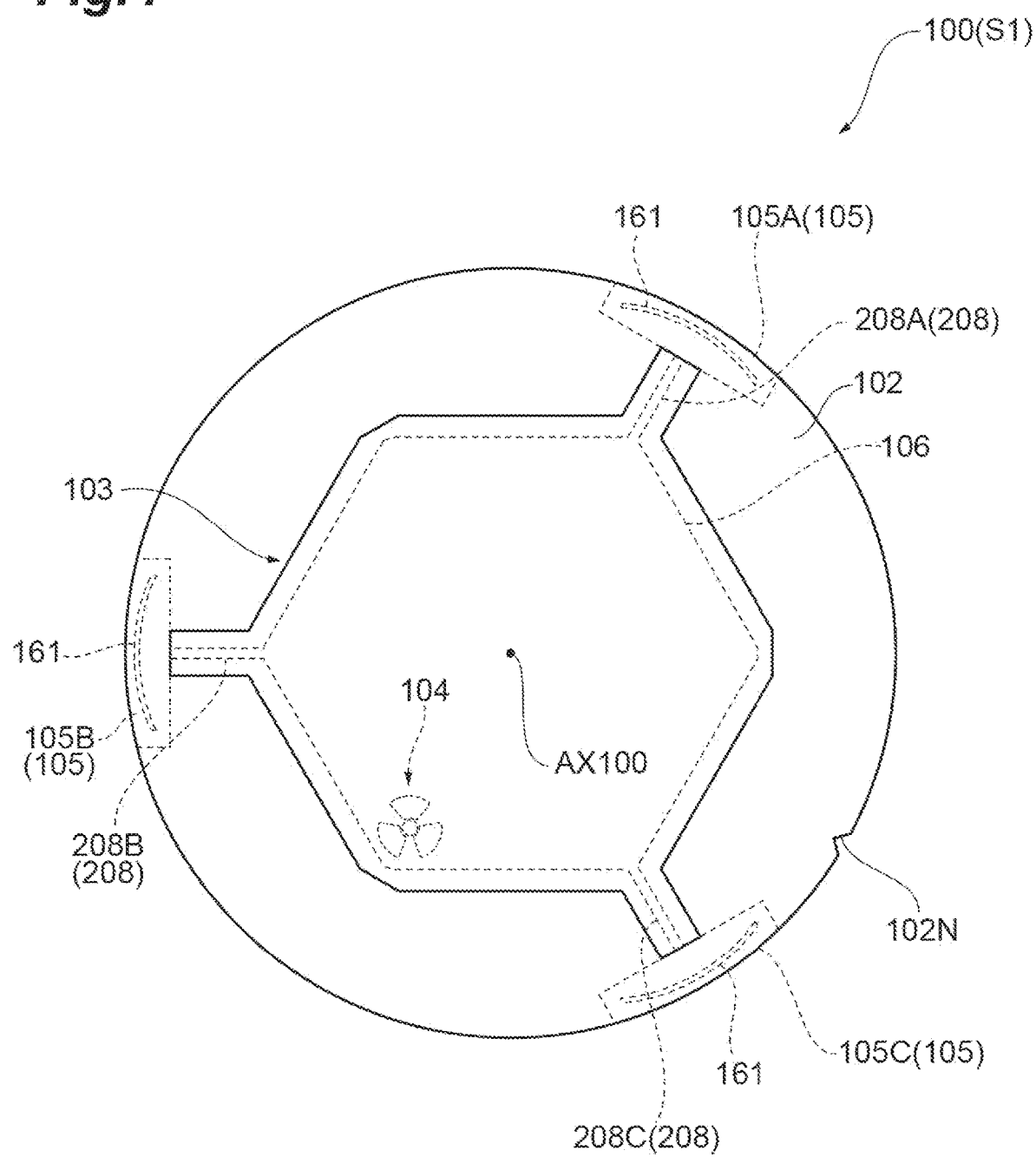
FIG. 4 is a plan view illustrating an example of a measuring device as viewed from a top surface side.

The transport fork 9 of the transport device TU2 is provided at a front end of a robot arm constituting the articulated robot. FIG. 4 is a schematic plan view for explaining the transport fork 9. As illustrated in FIG. 3, the transport fork 9 includes a base end portion 91 connected to the robot arm, and a pair of claw portions 92 bifurcated from the base end portion 91 and extending toward the front end. An upper surface 9*a* of the transport fork 9 may be flat. A pad portion 95 protruding upward is provided on the upper surface 9*a*. For example, the workpiece W is supported by the pad portion 95. A thickness of the pad portion 95 is different from the pad portion 85 provided on the transport fork 8. That is, the thickness of the pad portion 95 is larger or smaller than the thickness of the pad portion 85. The transport fork 9 and the pad portion 95 is formed of resin, for example.

An example of the pad portion 95 includes a plurality of pads 95*a*, 95*b*, 95*c*, and 95*d*. For example, the pads 95*a* and 95*b* are provided on the base end portion 91 of the transport fork 9, and the pads 95*c* and 95*d* are provided on the claw portion 92. In addition, the transport fork 9 includes a target electrode 97. The target electrode 97 may be embedded in the transport fork 9. An example of the target electrode 97 may be a disc-shaped metal member. The target electrode 97 and the target electrode 87 may have the same shape and size as each other. The target electrode 97 in the illustrated example is provided on the base end portion 91 in plan view. The target electrode 97 may be provided at a position close to one of the pair of claw portions 92 (the left claw portion in the illustrated example).

The process modules PM1 to PM6 are airtightly connected to the transfer module TF via the gate valve. Each of the process modules PM1 to PM6 is a processing device configured to perform a dedicated process such as plasma processing on the workpiece W.

A series of operations when the processing on the workpiece W is performed in the processing system 1 will be illustrated as follows. The transport device TU1 of the loader module LM takes out the workpiece W from any of the containers 4*a* to 4*d* and transports the workpiece W to the aligner AN. Subsequently, the transport device TU1 takes out the position-adjusted workpiece W from the aligner AN, and transports the workpiece W to one of the load lock module LL1 and the load lock module LL2. Next, one load lock module reduces the pressure in the preliminary decompression chamber to a predetermined pressure. Next, the transport device TU2 of the transfer module TF takes out the workpiece W from one of the load lock modules and transports the workpiece W to any of the process modules PM1 to PM6. Then, one or more process modules among the process modules PM1 to PM6 perform processing on the workpiece W. Then, the transport device TU2 transports the processed workpiece W from the process module to one of the load lock module LL1 and the load lock module LL2. Next, the transport device TU1 transports the workpiece W from one of the load lock modules to any of the containers 4*a* to 4*d*.

This processing system 1 includes the controller MC as described above. The controller MC can be a computer including a processor, a storage device such as a memory, a display device, an input/output device, a communication device, and the like. The series of operations of the processing system 1 described above are realized by controlling each part of the processing system 1 by the controller MC according to the program stored in the storage device.

Figure 5:
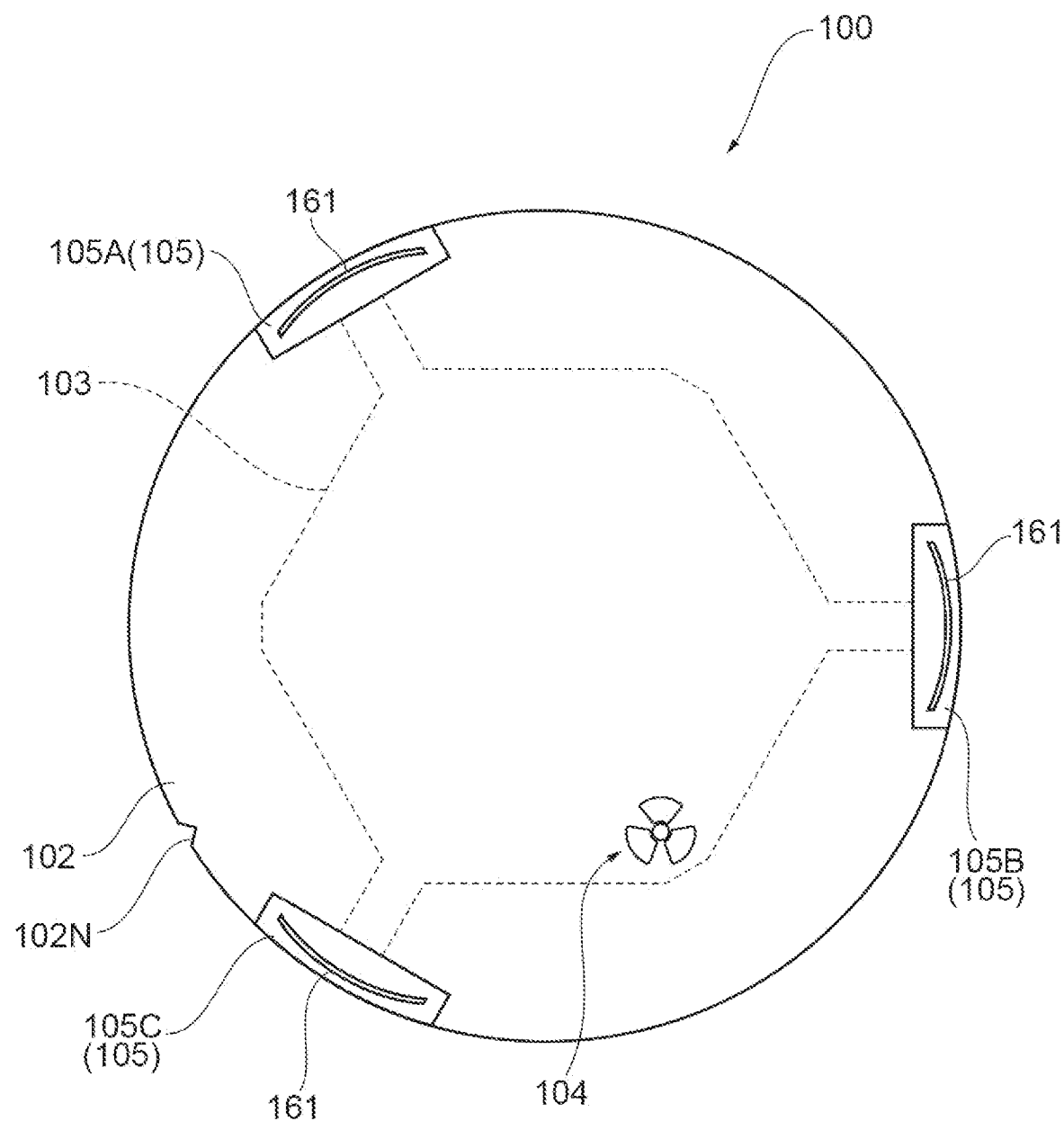
FIG. 5 is a plan view illustrating an example of the measuring device as viewed from a bottom surface side.

The measuring device will be described below. FIG. 4 is a plan view illustrating an example of a measuring device as viewed from a top surface side. FIG. 5 is a plan view illustrating an example of the measuring device as viewed from a bottom surface side. The measuring device 100 illustrated in FIGS. 4 and 5 includes a base board 102. The base board 102 is formed of silicon, for example. The base board 102 has a shape similar to a shape of the workpiece W, that is, a substantially disc shape. A diameter of the base board 102 is the same as a diameter of the workpiece W, for example, 300 mm. The shape and dimensions of the measuring device 100 are defined by the shape and dimensions of the base board 102. Therefore, the measuring device 100 has a shape similar to the shape of the workpiece W and has the same dimensions as the workpiece W. In addition, a notch 102N is formed on an edge of the base board 102.

A first sensor 104 for electrostatic capacitance measurement is provided on the base board 102. The first sensor 104 is provided on a bottom surface of the base board 102. The first sensor 104 in the illustrated example is provided on the bottom surface of the base board 102 at a position deviated from the center. An electrode surface of the first sensor 104 extends along the bottom surface of the base board 102.

In addition, a plurality of second sensors 105A to 105C for measuring electrostatic capacitance are provided on the base board 102. The plurality of second sensors 105A to 105C are arranged at equal intervals along the edge of the base board 102, for example, all around the edge. Specifically, each of the plurality of second sensors 105A to 105C is provided along the edge on the bottom surface side of the base board. A signal electrode 161 of each of the plurality of second sensors 105A to 105C extends along the bottom surface of the base board 102.

A circuit board 106 is provided in the center of the upper surface of the base board 102. Wiring groups 108A to 108D are provided between the circuit board 106 and the first sensor 104A for electrically connecting each other (see FIG. 8). In addition, wiring groups 208A to 208C are provided between the circuit board 106 and the plurality of second sensors 105A to 105C for electrically connecting each other. The circuit board 106, the wiring groups 108A to 108D, and the wiring groups 208A to 208C are covered with a cover 103.

Figure 6:
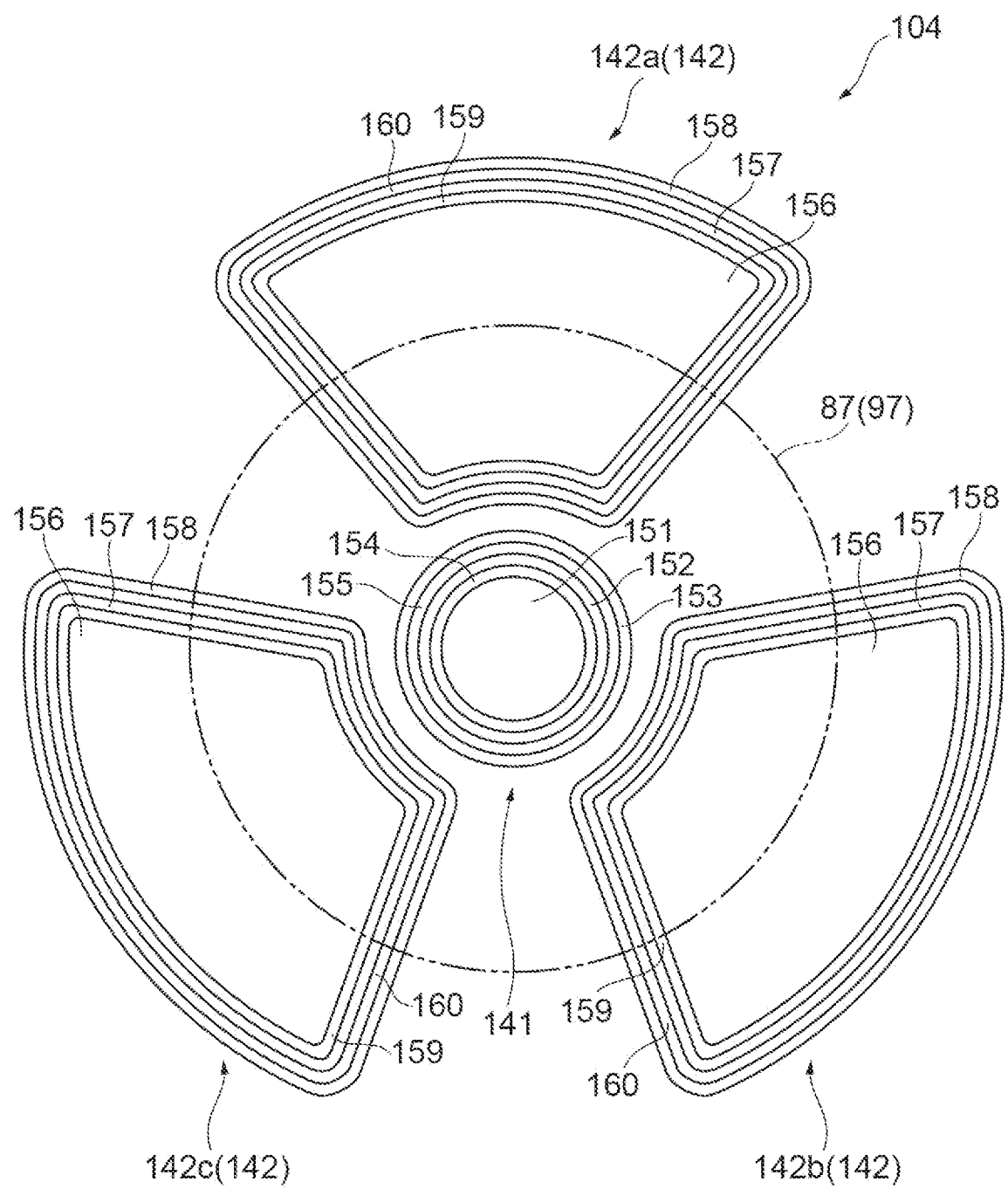
FIG. 6 is an enlarged view of a first sensor in FIG. 5.

Hereinafter, the first sensor will be described in detail. FIG. 6 is a partially enlarged view of FIG. 5 and illustrates the first sensor. The first sensor 104 includes a central electrode 141 and a plurality of peripheral electrodes 142a to 142c. The peripheral electrodes 142a to 142c are collectively referred to as the peripheral electrode 142. The central electrode 141 and the peripheral electrodes 142a to 142c are formed along the bottom surface of the base board 102.

In one example, when the measuring device 100 is transported by the transport forks 8 and 9, a positional relationship between the center of the measuring device 100 and the center of the target electrode 87 is the same as a positional relationship between the center of the measuring device 100 and the center of the target electrode 97 (see FIGS. 2 and 3). That is, when it is assumed that the target electrode 87 of the transport fork 8 overlaps the target electrode 97 of the transport fork 9, a center position and a rotational position of the measuring device 100, which is loaded on the transport forks 8 or 9, are controlled at a position where the center position and the rotational position of the measuring device 100, which is loaded on the transport fork 8 or 9, coincides with each other. In addition, when the measuring device 100 is loaded on the transport fork 8 based on the control, a position at the center of the first sensor 104 coincides with the center of the target electrode 87 of the transport fork 8. Similarly, when the measuring device 100 is loaded on the transport fork 9 based on the control, the position at the center of the first sensor 104 coincides with the center of the target electrode 97 of the transport fork 9.

As illustrated in FIG. 6, the central electrode 141 includes a circular signal electrode 151. A size of the central electrode 141 is sufficiently smaller than a size of the target electrode 87 or 97 provided on the transport fork 8 or 9. A diameter of the central electrode 141 may be, for example, about ½ to ¼ of the diameter of the target electrode 87 or 97.

In one exemplary embodiment, the central electrode 141 further includes a guard electrode 152 that surrounds the signal electrode 151. The guard electrode 152 has an annular shape. The guard electrode 152 surrounds the signal electrode 151 over the entire circumference thereof. The guard electrode 152 and the signal electrode 151 are spaced apart from each other so that an insulating region 154 is interposed therebetween. In addition, in one exemplary embodiment, the first sensor 104 further includes a ground electrode 153 that surrounds the guard electrode 152 at the outside of the guard electrode 152. The ground electrode 153 has an annular shape. The ground electrode 153 surrounds the guard electrode 152 over the entire circumference thereof. The guard electrode 152 and the ground electrode 153 are spaced apart from each other so that an insulating region 155 is interposed therebetween.

The peripheral electrodes 142a to 142c are arranged on a circle surrounding the central electrode 141. That is, the peripheral electrodes 142a to 142c are arranged at equal intervals in a circumferential direction with respect to the central electrode 141. The peripheral electrode 142 includes a signal electrode 156. The signal electrode 156 has a planar shape defined by two arcs that share the center of the central electrode 141 and has different radii. That is, the signal electrode 156 has a partially annular shape with a predetermined central angle. The central angle of the signal electrode 156 in the illustrated example is, for example, about 90°. The central angle of the signal electrode is not particularly limited.

In one exemplary embodiment, the peripheral electrode 142 further includes a guard electrode 157 that surrounds the signal electrode 156. The guard electrode 157 has a frame shape extending along an outer edge of the signal electrode 156. The guard electrode 157 surrounds the signal electrode 156 over the entire circumference thereof. The guard electrode 157 and the signal electrode 156 are spaced apart from each other so that an insulating region 159 is interposed therebetween. In addition, in one exemplary embodiment, the first sensor 104 further includes a ground electrode 158 that surrounds the guard electrode 157 at the outside of the guard electrode 157. The ground electrode 158 has a frame shape extending along the outer edge of the guard electrode 157. The ground electrode 158 surrounds the guard electrode 157 over the entire circumference thereof. The guard electrode 157 and the ground electrode 158 are spaced apart from each other so that an insulating region 160 is interposed therebetween. An insulating film is formed on the bottom surface of the base board 102. The insulating film covers the central electrode 141 and the peripheral electrodes 142a to 142c. The insulating film is formed of, for example, $SiO_2$, SiN, $Al_2O_3$, or polyimide.

Figure 7:
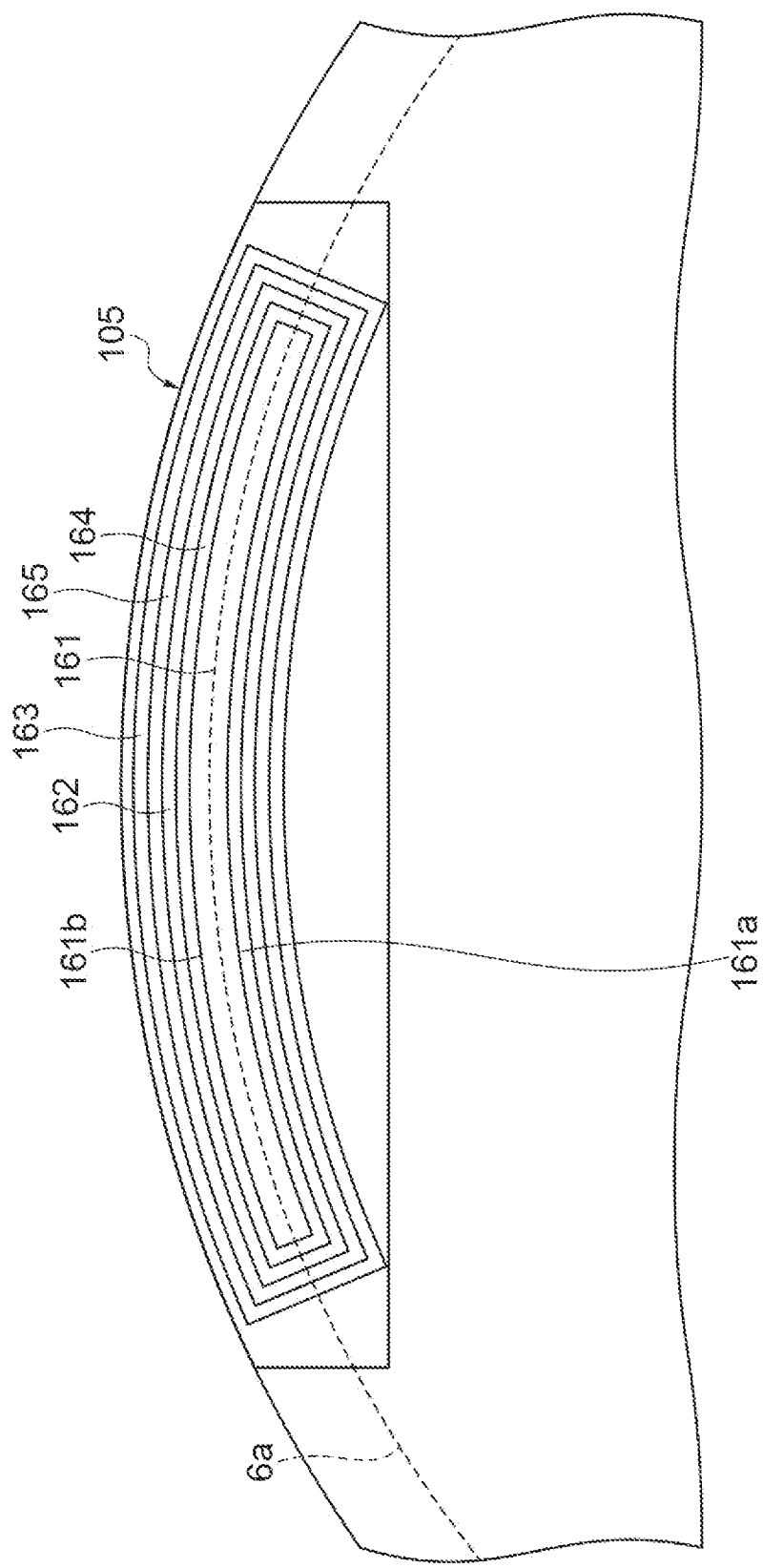
FIG. 7 is an enlarged view of a second sensor in FIG. 5.

Hereinafter, the second sensor will be described in detail. FIG. 7 is a partially enlarged view of FIG. 5 and illustrates one second sensor. The second sensor 105 has a signal electrode 161. An edge of the signal electrode 161 has partially an arc shape. For example, the signal electrode 161 has a planar shape defined by an inner edge 161a and an outer edge 161b, which are two arcs having different radii with respect to the central axis AX100. The outer edge 161b at the outside in the radial direction of each signal electrode 161 of the plurality of second sensors 105A to 105C extends on a common circle. In addition, the inner edge 161a at the inner side in the radial direction of each signal electrode 161 of the plurality of second sensors 105A to 105C extends on another common circle.

In one exemplary embodiment, the second sensor 105 further includes a guard electrode 162 that surrounds the signal electrode 161. The guard electrode 162 has a frame shape. The guard electrode 162 surrounds the signal electrode 161 over the entire circumference thereof. The guard electrode 162 and the signal electrode 161 are spaced apart from each other so that an insulating region 164 is interposed therebetween. In addition, in an exemplary embodiment, the second sensor 105 further includes an electrode 163 that surrounds the guard electrode 162 at the outside of the guard electrode 162. The electrode 163 has a frame shape. The electrode 163 surrounds the guard electrode 162 over the entire circumference thereof. The guard electrode 162 and the electrode 163 are spaced apart from each other so that an insulating region 165 is interposed therebetween. The second sensor 105 may be covered with an insulating film like the first sensor 104.

Figure 8:
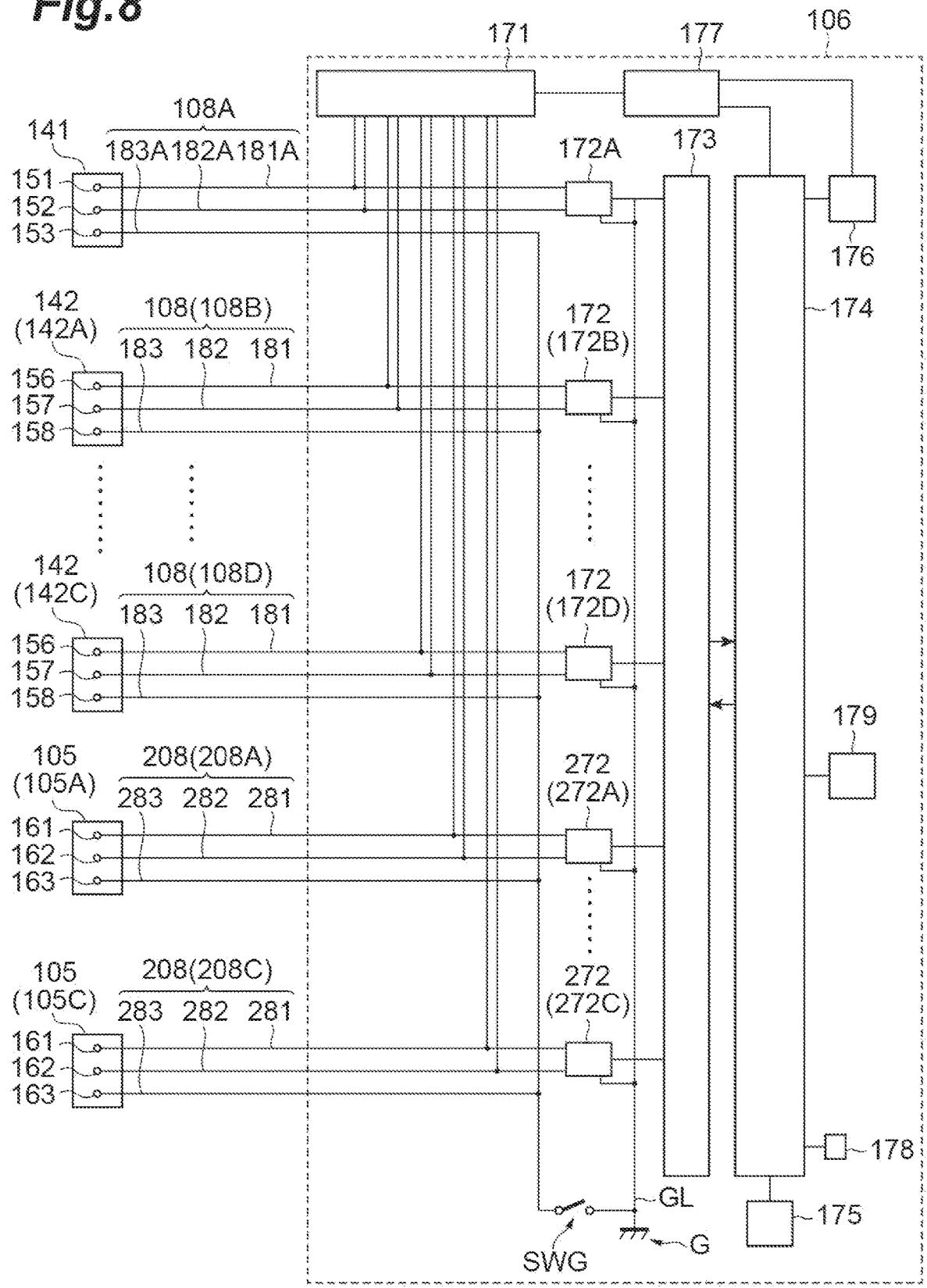
FIG. 8 is a view illustrating a configuration of a circuit board of the measuring device.

Hereinafter, the configuration of the circuit board 106 will be described. FIG. 8 is a view illustrating a configuration of a circuit board of the measuring device. The circuit board 106 includes a radio frequency oscillator 171, a C/V conversion circuit 172A, a plurality of C/V conversion circuits 172B to 172D, a plurality of C/V conversion circuits 272A to 272C, an A/D converter 173, a processor 174, a storage device 175, a communication device 176, and a power supply 177. In one example, an arithmetic device is configured with the processor 174, the storage device 175, and the like. In addition, the circuit board 106 includes a temperature sensor 179. The temperature sensor 179 outputs a signal corresponding to the measured temperature to the processor 174. For example, the temperature sensor 179 can acquire the temperature of the environment around the measuring device 100.

The central electrode 141 forming the first sensor 104 is connected to the circuit board 106 via the wiring group 108A. In addition, the central electrode 141 is connected to the C/V conversion circuit 172A via several wirings included in the wiring group 108A. Each of the peripheral electrodes 142 forming the first sensor 104 is connected to the circuit board 106 via the corresponding wiring group among the wiring groups 108B to 108D. In addition, each of the plurality of peripheral electrodes 142 is connected to the corresponding C/V conversion circuit among the plurality of C/V conversion circuits 172B to 172D via a couple of wirings included in the corresponding wiring group. Each of the plurality of second sensors 105A to 105C is connected to the circuit board 106 via the corresponding wiring group among the plurality of wiring groups 208A to 208C. In addition, each of the plurality of second sensors 105A to 105C is connected to the corresponding C/V conversion circuit among the plurality of C/V conversion circuits 272A to 272C via a couple of wirings included in the corresponding wiring group.

The central electrode 141, the wiring group 108A, and the C/V conversion circuit 172A, which form the first sensor 104, will be described below. In addition, a description will be made of one peripheral electrode 142 having the same configuration as each of the peripheral electrodes 142a to 142c, one wiring group 108 having the same configuration as each of the wiring groups 108B to 108D, and one C/V conversion circuit 172 having the same configuration as each of the C/V conversion circuits 172B to 172D. In addition, one second sensor 105 having the same configuration as each of the second sensors 105A to 105C, one wiring group 208 having the same configuration as each of the wiring groups 208A to 208C, and the C/V conversion circuit 272 having the same configuration as each of C/V conversion circuits 272A to 272C, will be described.

The wiring group 108A includes wirings 181A, 182A, and 183A. One end of the wiring 181A is connected to the signal electrode 151 forming the central electrode 141, and the other end of the wiring 181A is connected to the C/V conversion circuit 172. In addition, one end of the wiring 182 is connected to the guard electrode 152, and the other end of the wiring 182 is connected to the CN conversion circuit 172. One end of the wiring 183A is connected to the ground electrode 153. The wiring 183A is connected to a ground potential line GL connected to aground G of the circuit board 106. The wiring 183A may be connected to the ground potential line GL via a switch SWG.

The wiring group 108 includes wirings 181 to 183. One end of the wiring 181 is connected to the signal electrode 156 and the other end of the wiring 181 is connected to the CN conversion circuit 172. In addition, one end of the wiring 182 is connected to the guard electrode 157, and the other end of the wiring 182 is connected to the CN conversion circuit 172. In addition, one end of the wiring 183 is connected to the ground electrode 158 forming the peripheral electrode 142. The wiring 183 is connected to the ground potential line GL connected to the ground G of the circuit board 106. The wiring 183 may be connected to the ground potential line GL via the switch SWG.

The wiring group 208 includes wirings 281 to 283. One end of the wiring 281 is connected to the signal electrode 161 and the other end of the wiring 281 is connected to the CN conversion circuit 272. In addition, one end of the wiring 282 is connected to the guard electrode 162, and the other end of the wiring 282 is connected to the CN conversion circuit 272. In addition, one end of the wiring 283 is connected to the electrode 163. The wiring 283 is connected to the ground potential line GL connected to the ground G of the circuit board 106. The wiring 283 may be connected to the ground potential line GL via the switch SWG.

The radio frequency oscillator 171 is connected to the power supply 177 such as a battery, and is configured to receive power from the power supply 177 to generate a radio frequency signal. The power supply 177 is also connected to the processor 174, the storage device 175, and the communication device 176. The radio frequency oscillator 171 includes a plurality of output lines. The radio frequency oscillator 171 applies the generated radio frequency signal to the wiring 181A, the wiring 182A, the wiring 181, the wiring 182, the wiring 281, and the wiring 282, via the plurality of output lines. The radio frequency oscillator 171 is electrically connected to the signal electrode 151 and the guard electrode 152 of the central electrode 141 forming the first sensor 104. The radio frequency signal from the radio frequency oscillator 171 is applied to the signal electrode 151 and the guard electrode 152. The radio frequency oscillator 171 is electrically connected to the signal electrode 156 and guard electrode 157 of the peripheral electrode 142 forming the first sensor 104. The radio frequency signal from the radio frequency oscillator 171 is applied to the signal electrode 156 and the guard electrode 157. In addition, the radio frequency oscillator 171 is electrically connected to the signal electrode 161 and the guard electrode 162 of the second sensor 105, and the radio frequency signal from the radio frequency oscillator 171 is applied to the signal electrode 161 and the guard electrode 162.

The wiring 181 and the wiring 182 are connected to an input of the C/V conversion circuit 172A. That is, the signal electrode 151 and the guard electrode 152 of the central electrode 141 forming the first sensor 104 are connected to the input of the C/V conversion circuit 172A. In addition, similarly, the signal electrode 156 and the guard electrode 157 of the peripheral electrode 142 forming the first sensor 104 are connected to an input of the C/V conversion circuit 172. In addition, each of the signal electrode 161 and the guard electrode 162 is connected to the input of the C/V conversion circuit 272. The C/V conversion circuit 172A, the C/V conversion circuit 172, and the C/V conversion circuit 272 are configured to generate a voltage signal having an amplitude corresponding to the potential difference at the input, and to output the voltage signal. The C/V conversion circuit 172A generates a voltage signal according to electrostatic capacitance formed by the central electrode 141. That is, as the electrostatic capacitance of the signal electrode 151 connected to the C/V conversion circuit 172A increases, the magnitude of the voltage of the voltage signal output by the CN conversion circuit 172A increases. Similarly, as the electrostatic capacitance of the signal electrodes connected to the C/V conversion circuit 172 and the C/V conversion circuit 272 increases, the magnitude of the voltages of the voltage signals output by the C/V conversion circuit 172 and the C/V conversion circuit 272 increases.

The outputs of the C/V conversion circuit 172A, the C/V conversion circuit 172, and the C/V conversion circuit 272 are connected to the input of the A/D converter 173. In addition, the A/D converter 173 is connected to the processor 174. The A/D converter 173 is controlled by the control signal from the processor 174, converts the output signals (voltage signals) of the CN conversion circuit 172A, the C/V conversion circuit 172, and the C/V conversion circuit 272 into digital values, and outputs the digital values to the processor 174 as detection values.

The storage device 175 is connected to the processor 174. The storage device 175 is a storage device such as a volatile memory, and is configured to store measurement data, for example. In addition, another storage device 178 is connected to the processor 174. The storage device 178 is a storage device such as a non-volatile memory, and stores, for example, a program read and executed by the processor 174.

The communication device 176 is a communication device compliant with any wireless communication standard. For example, the communication device 176 is compliant with Bluetooth®. The communication device 176 is configured to wirelessly transmit the measurement data stored in the storage device 175.

The processor 174 is configured to control each part of the measuring device 100 by executing the program described above. For example, the processor 174 controls the supply of the radio frequency signals from the radio frequency oscillator 171 to the signal electrode 151, the guard electrode 152, the signal electrode 156, the guard electrode 157, the signal electrode 161, and the guard electrode 162. In addition, the processor 174 controls the supply of the power from the power supply 177 to the storage device 175, the supply of the power from the power supply 177 to the communication device 176, and the like. Furthermore, the processor 174 acquires the measurement value of the central electrode 141 forming the first sensor 104, the measurement value of the peripheral electrode 142, and the measurement value of the second sensor 105 based on the detection value input from the A/D converter 173 by executing the program described above. In an embodiment, when the detection value output from the A/D converter 173 is X, in the processor 174, the measurement value is acquired based on the detection value such that the measurement value becomes a value proportional to (a·X+b). Here, a and b are constants that change depending on the state of the circuit, and the like. The processor 174 may have, for example, a predetermined arithmetic expression (function) such that the measurement value becomes a value proportional to (a·X+b).

In the measuring device 100 described above, the first sensor 104 of the measuring device 100 can face the target electrodes 87 and 97 provided on the transport forks, in a state where the measuring device 100 is supported by the transport forks 8 and 9. The electrostatic capacitance acquired by the central electrode 141 and the peripheral electrode 142 forming the first sensor 104 indicates a positional relationship between the first sensor 104 and the target electrodes 87 and 97, that is, a positional relationship between the transport forks 8 and 9 and the measuring device 100. In this case, the electrostatic capacitance C is expressed by C=εS/d. ε is a dielectric constant of the medium between the first sensor 104 and the target electrodes 87 and 97. d is a distance between the first sensor and the target electrodes 87 and 97. When the measuring device 100 is loaded on the pad of the transport fork, distance d does not normally vary.

Considering the peripheral electrode 142, S can be regarded as an area where the signal electrode 156 overlaps the target electrodes 87 and 97 in plan view. The area S can vary depending on the relative positional relationship between the peripheral electrode 142 and the target electrode 87 and 97. As illustrated in FIG. 6, the overlapping areas of the signal electrode 156 of each of the peripheral electrodes 142a, 142b and 142c and the target electrodes 87 and 97 are the same at the reference position. On the other hand, when the transport position is deviated, the overlapping area of the signal electrode 156 of the peripheral electrode 142 and the target electrodes 87 and 97 arranged in the deviated direction becomes small. Moreover, the overlapping area of the signal electrode 156 of the peripheral electrode 142 and the target electrodes 87 and 97 disposed opposite to the deviated direction becomes large. Therefore, according to the measuring device 100, measurement data for reflecting the relative positional relationship between the measuring device 100, which imitates the workpiece W, and the transport forks 8 and 9 can be acquired. For example, transport position data of the transport devices TU1 and TU2 can be calibrated based on such data.

Further, S in the central electrode 141 can be regarded as an area where the signal electrode 151 overlaps the target electrodes 87 and 97 in plan view. However, since the target electrodes 87 and 97 are sufficiently larger than the central electrode 141, the area S does not vary when the amount of deviation of the transport position of the measuring device 100 is within a normally assumed range. Therefore, assuming that the area S does not change, the electrostatic capacitance C acquired by the central electrode 141 reflects the distance between the central electrode 141 and the target electrodes 87 and 97. In one example, the thickness of the pad portion 85 provided on the transport fork 8 and the thickness of the pad portion 95 provided on the transport fork 9 are different from each other. In this case, it is possible to determine on which the transport fork 8 or 9 the measuring device 100 is loaded based on the electrostatic capacitance C of the central electrode 141.

Moreover, a state where the measuring device 100 is loaded on the support stand 6 of the aligner AN or the loading stand 7 of the load lock module is considered. Since the concept is the same for both the aligner AN and the load lock module, the aligner AN will be described herein. When the measuring device 100 is loaded on the support stand 6, the plurality of signal electrodes 161 face the loading surface 6a. As described above, the electrostatic capacitance C is expressed by C=εS/d. ε is a dielectric constant of the medium between the signal electrode 161 and the loading surface. d is a distance between the signal electrode 161 and the loading surface. S can be regarded as an area where the signal electrode 161 and the loading surface overlap each other in plan view. The area S varies depending on the relative positional relationship between the measuring device 100 and the loading surface 6a in plan view. Therefore, according to the measuring device 100, measurement data for reflecting the relative positional relationship between the measuring device 100, which imitates the workpiece W, and the loading surface 6a can be acquired.

Figure 9:
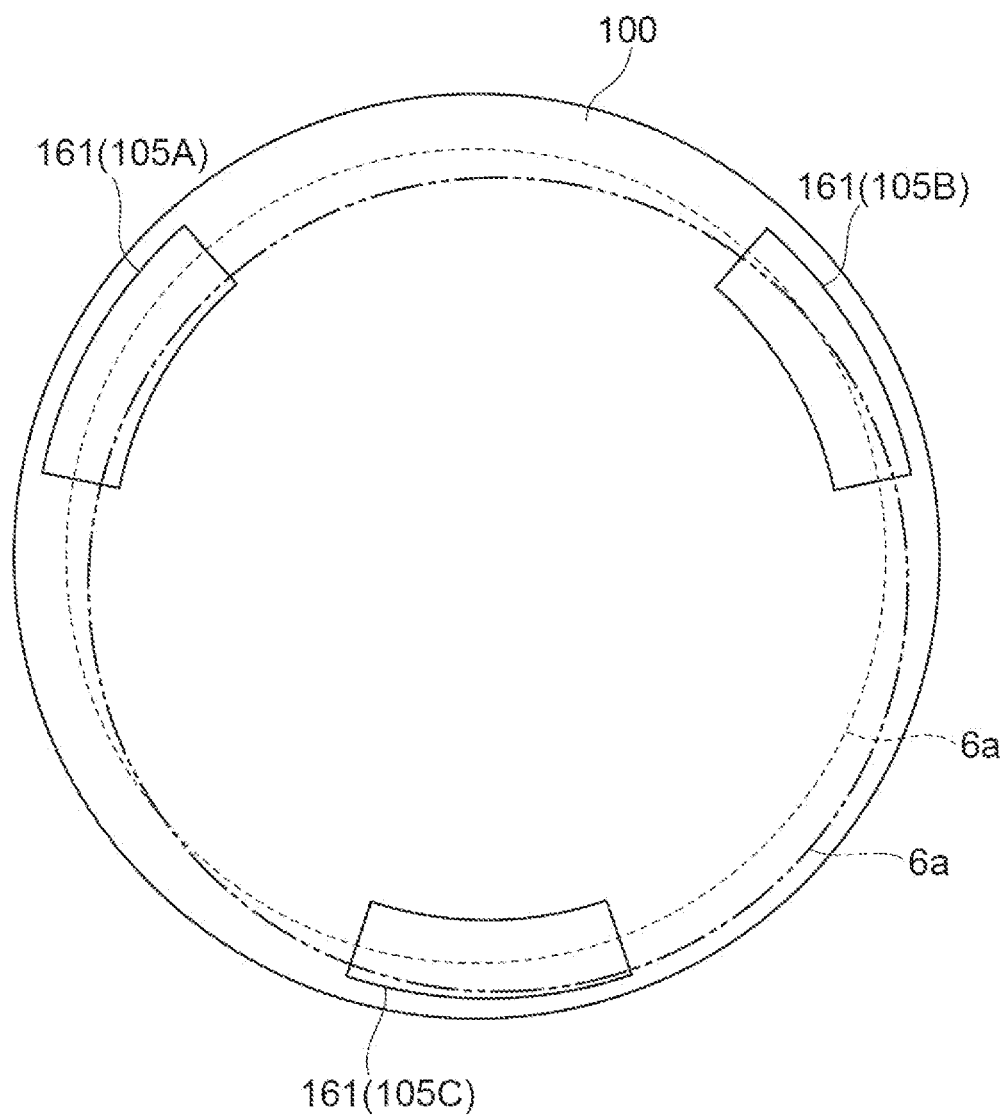
FIG. 9 is a schematic view for explaining the second sensor.

FIG. 9 is a schematic view for explaining a function of the second sensor 105. As indicated by the broken line in FIG. 9, when the measuring device 100 is transported to a reference position where the center of the support stand 6 of the aligner AN coincides with the center of the measuring device 100, the edge of the loading surface 6a passes through the signal electrode 161 in plan view. In this case, as indicated by a two-dot chain line in FIG. 9, when the transport position of the measuring device 100 deviates from a predetermined reference position, the overlapping area S of the signal electrode 161 disposed in the deviated direction and the loading surface 6a becomes small. That is, the electrostatic capacitance measured by the signal electrode 161 becomes smaller than the electrostatic capacitance when the measuring device 100 is transported to the reference position. On the contrary, the overlapping area S of the signal electrode 161 disposed opposite to the deviated direction and the loading surface 6a becomes large. That is, the electrostatic capacitance measured by the signal electrode 161 becomes larger than the electrostatic capacitance when the measuring device 100 is transported to the reference position. Therefore, an amount of deviation of each signal electrode 161 in each radial direction of the support stand 6 can be obtained based on the measurement value indicating the electrostatic capacitance of each signal electrode 161 of the second sensors 105A to 105C. Then, a difference from the reference position of the transport position of the measuring device 100 can be obtained based on the amount of deviation of each signal electrode 161 of the second sensors 105A to 105C in each radial direction. For example, transport position data of the transport devices TU1 and TU2 can be calibrated based on such data.

Figure 10:
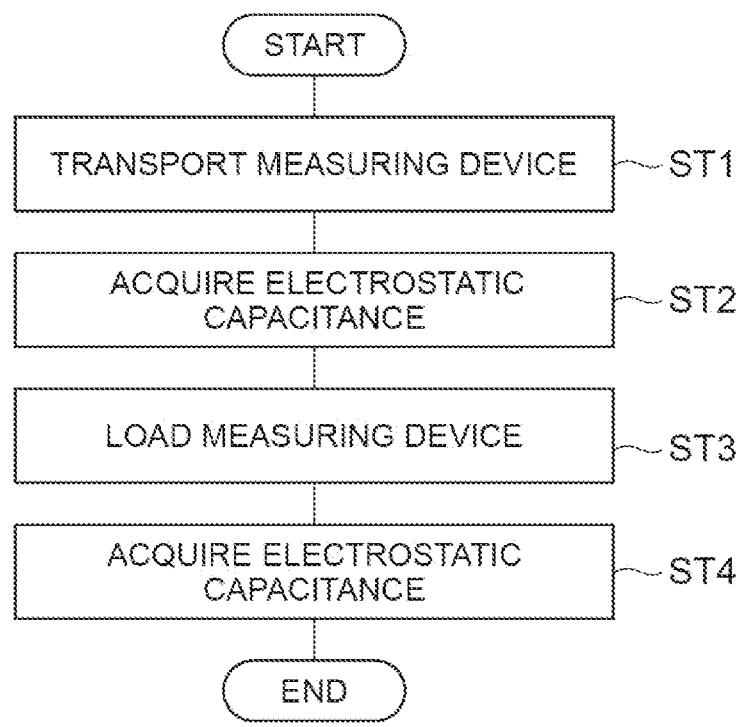
FIG. 10 is a flowchart illustrating an operation of a measuring system.

Next, a measuring method of electrostatic capacitance using the above-described measuring device 100 will be described. FIG. 10 is a flowchart illustrating a measuring method using the measuring device. As illustrated in FIG. 10, in one example of the measuring method, the measuring device 100 is transported by the transport fork (step ST1), and electrostatic capacitance is acquired by the measuring device loaded on the transport fork (step ST2). Further, the transported measuring device 100 is loaded at a predetermined position (step ST3), and electrostatic capacitance is acquired by the loaded measuring device 100 (step ST4).

As described above, the transport devices TU1 and TU2 in the processing system 1 are controlled by the controller MC. In one example, the transport device TU1 of the loader module LM takes out the measuring device 100 from any of the containers 4a to 4d based on transport position data transmitted from the controller MC, and transports the measuring device 100 to the aligner AN. For example, the transport position data may be coordinate data predetermined so that the position of the central axis AX100 of the measuring device 100 coincides with the center position of the loading surface of the support stand 6.

When the measuring device 100 is transported to the aligner AN by the transport device TU1, the measuring device 100 loaded on the transport fork 8 acquires a digital value according to the electrostatic capacitance between the target electrode 87 of the transport fork 8 and the signal electrode 151 of the first sensor 104. The digital value is stored in the storage device 175. In one exemplary embodiment, the amount of deviation (difference) at the center of the measuring device 100 with respect to the transport fork 8 may be derived based on the electrostatic capacitance acquired by the first sensor 104. In this case, the center position and rotational position of the measuring device 100 accommodated in the container need to coincide with predetermined reference positions.

In addition, the measuring device 100 acquires a plurality of digital values (measurement values) according to the electrostatic capacitance between the support stand 6 and the signal electrode 161 of each of the second sensors 105A to 105C in a state where the measuring device 100 is loaded on the loading surface 6a of the support stand 6. The plurality of digital values are stored in the storage device 175. In one exemplary embodiment, the amount of deviation (difference) at the center of the measuring device 100 with respect to the center position of the loading surface 6a may be derived based on the respective electrostatic capacitances acquired by the second sensors 105A to 105C.

Subsequently, the transport device TU1 takes out the position-adjusted measuring device 100 from the aligner AN, and transports the measuring device 100 to one of the load lock module LL1 and the load lock module LL2. For example, the transport position data may be coordinate data predetermined so that the position of the central axis AX100 of the measuring device 100 coincides with the center position of the loading surface 7a of the loading stand 7 in the load lock module.

When the measuring device 100 is taken out from the aligner AN by the transport device TU1, the measuring device 100 loaded on the transport fork 8 acquires a digital value according to the electrostatic capacitance between the target electrode 87 of the transport fork 8 and the signal electrode 151 of the first sensor 104. The digital value is stored in the storage device 175. In one exemplary embodiment, the amount of deviation (difference) at the center of the measuring device 100 with respect to the transport fork 8 may be derived based on the electrostatic capacitance acquired by the first sensor 104.

In addition, when the measuring device 100 is loaded on the loading stand 7 of the load lock module, the measuring device 100 acquires a plurality of digital values according to the electrostatic capacitance between the loading stand 7 and the signal electrode 161 of each of the second sensors 105A to 105C. The plurality of digital values are stored in the storage device 175. In one exemplary embodiment, the amount of deviation (difference) at the center of the measuring device 100 with respect to the center position of the loading surface 7a may be derived based on the respective electrostatic capacitances acquired by the second sensors 105A to 105C.

Next, one load lock module reduces the pressure in the preliminary decompression chamber to a predetermined pressure. Next, the transport device TU2 of the transfer module TF takes out the measuring device 100 from one of the load lock modules and transports the measuring device 100 to any of the process modules PM1 to PM6.

When the measuring device 100 is taken out from the aligner AN by the transport device TU2, the measuring device 100 loaded on the transport fork 9 acquires a digital value according to the electrostatic capacitance between the target electrode 97 of the transport fork 9 and the signal electrode 151 of the first sensor 104. The digital value is stored in the storage device 175. In one exemplary embodiment, the amount of deviation (difference) at the center of the measuring device 100 with respect to the transport fork 9 may be derived based on the electrostatic capacitance acquired by the first sensor 104. Each amount of deviation, which is acquired in a state where the measuring device 100 is loaded on each of the support stand 6 of the aligner AN, the transport fork 8, the loading stand 7 of the load lock module, and the transport fork 9, may be used for calibrating the transport position data that is used in transportation by the transport device TU1 and transport device TU2.

As described above, in one exemplary embodiment, there is provided a measuring system that acquires a measurement value indicating electrostatic capacitance between a measuring device 100 and a first object for transporting the measuring device 100. The measuring system includes the measuring device 100 and the transport system S1. The transport forks 8 and 9, which are first objects, include the target electrodes 87 and 97, respectively. The measuring device 100 includes the first sensor 104 provided along the bottom surface of the base board 102, and the circuit board 106 loaded on the base board 102 and connected to the first sensor 104. The first sensor 104 includes the central electrode 141 and three or more peripheral electrodes 142. The central electrode 141 has an area smaller than that of the target electrode 87 or 97 and acquires electrostatic capacitance for reflecting a distance between the target electrodes 87 and 97. Three or more peripheral electrodes 142 are disposed around the central electrode 141 and acquire electrostatic capacitance for reflecting an amount of deviation in a horizontal direction with respect to the target electrode 87 or 97.

In the measuring system, the measuring device 100 is transported by the transport fork 8 or 9 in a state where the measuring device 100 is loaded on the transport fork 8 or 9. When the first sensor 104 of the measuring device 100 faces the target electrode 87 or 97 of the transport fork 8 or 9, the electrostatic capacitance between the first sensor 104 and the target electrode 87 or 97 is acquired by the measuring device 100. Since the electrostatic capacitance acquired by three or more peripheral electrodes 142 of the first sensor 104 reflects the amount of deviation in the horizontal direction of the first sensor 104 with respect to the target electrode 87 or 97, it is possible to acquire an amount of deviation of the measuring device 100 which is an object to be transported.

Further, since the central electrode 141 of the first sensor 104 has an area smaller than that of the target electrode 87 or 97, a range in which the entire central electrode 141 overlaps the target electrode 87 or 97 indicates constant electrostatic capacitance. That is, when the electrostatic capacitance acquired by the central electrode 141 is within a predetermined range, it can be regarded that the measuring device 100 is normally loaded on the transport fork 8 or 9. In addition, when the electrostatic capacitance acquired by the central electrode 141 is out of the predetermined range, it is suggested that the measuring device 100 may not be normally loaded, such as a case where the measuring device 100 is obliquely loaded on the transport fork 8 or 9.

Therefore, the measuring device 100 is transported by the transport fork 8 or 9, so that it is possible to easily measure the amount of deviation of the transport position of the measuring device 100, which is an object to be transported, while confirming that the transportation is normally performed. The amount of deviation of the measuring device 100 is acquired, so that it is possible to adjust the position of the transport fork 8 or 9. For example, the controller MC may adjust the position of the transport fork 8 or 9 so that the amount of deviation of the measuring device 100 becomes zero. The measurement of the electrostatic capacitance and the position adjustment of the transport fork may be automatically performed.

In one exemplary embodiment, the measuring device 100 further includes a plurality of second sensors 105 arranged along an edge of the base board 102 to acquire a measurement value indicating electrostatic capacitance between the measuring device 100 and the support stand 6 or loading stand 7, which is second object. The support stand 6 has the circular loading surface 6a in plan view. In addition, the loading stand 7 has the circular loading surface 7a in plan view. When the base board 102 is loaded on the loading surface 6a or 7a so that the center of the loading surface 6a or 7a coincides with the center of the base board 102, the outer peripheral edges of the loading surfaces 6a and 7a face the plurality of second sensors 105. With this configuration, when the measuring device 100 is loaded on the loading surface 6a or 7a by the transport fork, the measuring device 100 can acquire electrostatic capacitance indicating a positional relationship between the loading surface 6a or 7a and the measuring device 100. That is, during the transportation operation of the transport fork to the loading surface of the measuring device 100, the measuring device 100 can acquire electrostatic capacitance between the target electrode of the transport fork and the first sensor 104 and electrostatic capacitance between the loading surface and the second sensor 105.

In one exemplary embodiment, the transport fork 8 has the pad portion 85 projecting upward. The transport fork 9 has the pad portion 95 protruding upward. The measuring device 100 is loaded on the transport fork 8 while being supported by the pad portion 85, and is loaded on the transport fork 9 while being supported by the pad portion 95. The thickness of the pad portion 85 is different from the thickness of the pad portion 95. With this configuration, it can be determined whether the measuring device 100 is loaded on either the transport fork 8 or the transport fork 9 based on the electrostatic capacitance acquired by the central electrode 141. When a user acquires the measurement value by the measuring device 100 in real time or when the user analyzes the measurement value by the measuring device 100 in the post process, it is possible to easily know the transport position of the measuring device 100.

Although various exemplary embodiments are described above, without being limited to the exemplary embodiments described above, various omissions, substitutions, and changes may be made. In addition, elements from different embodiments can be combined to form other embodiments.

Figure 11:
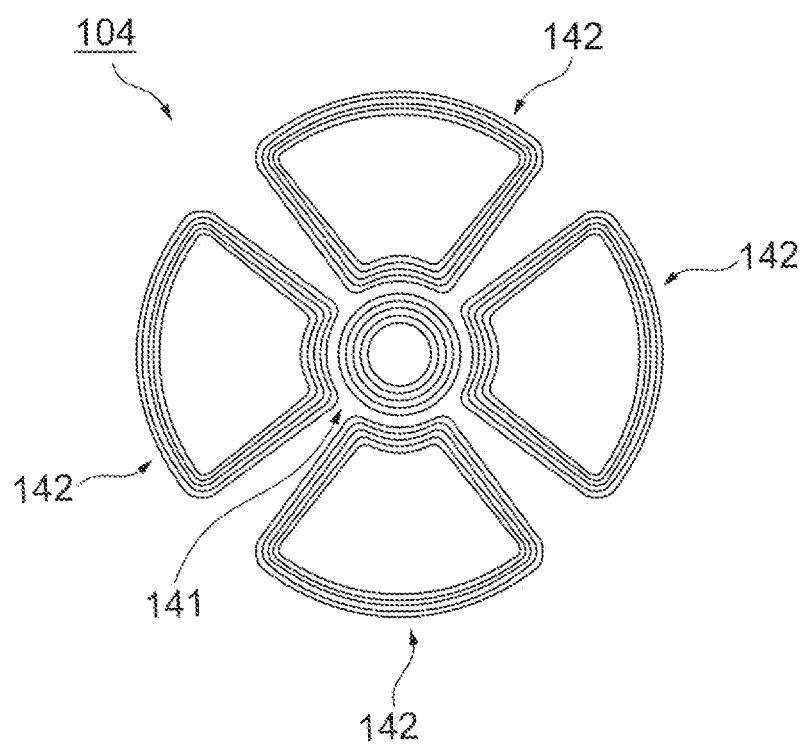
FIG. 11 is a view illustrating a first sensor according to another example.

For example, the form of the first sensor provided on the measuring device 100 is not limited to the above example. FIG. 11 is a plan view illustrating a first sensor 104 according to another example. As illustrated in FIG. 11, in one example, the first sensor 104 may include a central electrode 141 and four peripheral electrodes 142. In this example, four peripheral electrodes 142 are arranged at equal intervals in a circumferential direction with respect to the central electrode 141. With this configuration, since four peripheral electrodes 142 are arranged on two orthogonal axes, it is possible to acquire transport position data with higher accuracy. The number of peripheral electrodes may be two or less, or may be five or more.

Moreover, although substantially fan-shaped peripheral electrodes are exemplified, the shape of the peripheral electrode is not limited thereto. For example, the peripheral electrode may be substantially circular in plan view.

From the foregoing description, it will be appreciated that various embodiments of the present disclosure have been described herein, and that various modifications may be made without departing from the scope and spirit of the present disclosure. Accordingly, the various embodiments disclosed herein are not intended to be limiting, with the true scope and spirit being indicated by the aspects following claims.

What is claimed is:

1. A measuring system that acquires a measurement value indicating electrostatic capacitance between a measuring device and a first object for transporting the measuring device,
wherein the first object includes a body on which the measuring device is loaded, and a target electrode provided on the body,
the measuring device includes:
a disc-shaped base board;
a first sensor provided along a bottom surface of the disc-shaped base board; and
a circuit board installed on the disc-shaped base board and connected to the first sensor, and
the first sensor includes:
a central electrode configured to acquire electrostatic capacitance for reflecting a distance with the target electrode; and
a peripheral electrode disposed around the central electrode to acquire electrostatic capacitance for reflecting an amount of deviation in a horizontal direction with respect to the target electrode of the first object.

2. The measuring system according to claim 1, wherein the central electrode has an area smaller than that of the target electrode.

3. The measuring system according to claim 1, wherein three or more peripheral electrodes are disposed around the central electrode.

4. The measuring system according to claim 1, wherein the first object is a transport fork provided in a semiconductor processing system for transporting a workpiece.

5. The measuring system according to claim 1, wherein the first object is a first transport fork or a second transport fork provided in a semiconductor processing system for transporting a workpiece,
the first transport fork has a first pad protruding upward,
the second transport fork has a second pad protruding upward,
the measuring device is loaded on the first transport fork while being supported by the first pad, and is loaded on the second transport fork while being supported by the second pad, and
a thickness of the first pad is different from a thickness of the second pad.

6. The measuring system according to claim 1, wherein the measuring device further includes a plurality of second sensors arranged along an edge of the disc-shaped base board to acquire a measurement value indicating electrostatic capacitance between the measuring device and a second object, the second object has a circular loading surface in plan view, and when the disc-shaped base board is loaded on the loading surface so that a center of the loading surface coincides with a center of the disc-shaped base board, an outer peripheral edge of the loading surface faces the plurality of second sensors.

7. The measuring system according to claim 6, wherein the second object is a base of an aligner or a load lock module provided in a semiconductor processing system.

8. A measuring device that acquires a measurement value indicating electrostatic capacitance between the measuring device and an object,
wherein the object includes a body on which the measuring device is loaded in order to transport the measuring device, and an electrode provided on the body,
the measuring device includes:
a disc-shaped base board;
a sensor provided along a bottom surface of the disc-shaped base board; and
a circuit board installed on the disc-shaped base board and connected to the sensor, and the sensor includes:
a central electrode having an area smaller than that of the electrode of the object and configured to acquire electrostatic capacitance for reflecting a distance with the electrode; and
three or more peripheral electrodes disposed around the central electrode to acquire electrostatic capacitance for reflecting an amount of deviation in a horizontal direction with respect to the electrode of the object.

9. A measuring method for acquiring a measurement value indicating electrostatic capacitance between a measuring device and an object,
in which the object includes a body on which the measuring device is loaded in order to transport the measuring device, and a target electrode provided on the body,
the measuring device includes:
a disc-shaped base board;
a sensor provided along a bottom surface of the disc-shaped base board; and
a circuit board installed on the disc-shaped base board and connected to the sensor,
the sensor includes:
a central electrode having an area smaller than that of the target electrode of the object and configured to acquire electrostatic capacitance for reflecting a distance with the target electrode; and
three or more peripheral electrodes disposed around the central electrode to acquire electrostatic capacitance for reflecting an amount of deviation in a horizontal direction with respect to the target electrode of the object,
the method comprising:
holding the measuring device by the object so that the measuring device is loaded on the object; and
acquiring a plurality of measurement values, which indicate electrostatic capacitance, based on each of voltage amplitudes in the central electrode and the three or more peripheral electrodes by applying a radio frequency signal to the central electrode and the three or more peripheral electrodes, in a state where the measuring device is loaded on the object.

* * * * *